United States Patent
Chuang

(10) Patent No.: US 7,310,016 B2
(45) Date of Patent: Dec. 18, 2007

(54) CHOPPER-STABILIZED OPERATIONAL AMPLIFIER AND METHOD

(75) Inventor: Shang-Yuan Chuang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 81 days.

(21) Appl. No.: 11/378,906

(22) Filed: Mar. 17, 2006

(65) Prior Publication Data

US 2007/0013438 A1    Jan. 18, 2007

Related U.S. Application Data

(60) Provisional application No. 60/698,754, filed on Jul. 13, 2005.

(51) Int. Cl.
*H03F 1/02* (2006.01)
(52) U.S. Cl. .......................... 330/9; 330/311
(58) Field of Classification Search ............ 330/9, 330/311, 255, 261, 310; 327/124, 307

See application file for complete search history.

(56) References Cited

U.S. PATENT DOCUMENTS

| | | | |
|---|---|---|---|
| 6,002,299 A | 12/1999 | Thomsen | 330/9 |
| 6,307,430 B1 | 10/2001 | Thomsen et al. | 330/9 |
| 6,734,723 B2 * | 5/2004 | Huijsing et al. | 330/9 |
| 7,209,000 B2 * | 4/2007 | Huijsing et al. | 330/9 |
| 7,233,198 B2 * | 6/2007 | Niederkorn | 330/9 |

* cited by examiner

*Primary Examiner*—Henry Choe
(74) *Attorney, Agent, or Firm*—Wade J. Brady, III; Frederick J. Telecky, Jr.

(57) ABSTRACT

An amplifier circuit includes an input chopping circuit for chopping first and second input signals, a transconductance stage for amplifying an output of the chopping circuit and applying it to the input of a folded cascode stage, to the input of an un-chopping circuit, and to the input of a chopper-stabilized gain boost amplifier. The output of the un-chopping circuit drives sources of cascode transistors of the folded cascode stage. The gain boost amplifier includes another transconductance stage having another un-chopping circuit coupled to the gate of one of the cascode transistors of the folded cascode stage. The drains of cascode transistors of the folded cascode stage drive a class AB output stage. The amplifier provides both highly linear operation and low 1/f noise.

20 Claims, 7 Drawing Sheets

CHOPPER-STABILIZED OPERATIONAL AMPLIFIER AND METHOD

CROSS REFERENCE TO RELATED APPLICATION

This application claims the benefit of prior filed now abandoned U.S. provisional application Ser. No. 60/698,754 filed Jul. 13, 2005 entitled "Chopper-stabilized OPAMP" by Shang-Yuan Chuang.

BACKGROUND OF THE INVENTION

The present invention relates generally to chopper-stabilized amplifiers, and more particularly to a way of providing lower-cost operational amplifiers having both low 1/f noise and low drift.

In conventional chopper-stabilized operational amplifiers, the externally applied differential input signal is "chopped" so as to reverse its polarity in response to each pulse of the chopping signal before being applied to the input stage of the "core" amplifying circuitry. This causes a corresponding reversal of the polarity of the differential output signal produced by the amplifying circuitry. If the externally applied differential input signal is zero but the input transistors of the input stage are slightly mismatched so as to produce an input offset voltage, the chopping causes the resulting differential output signal to appear as pulses having a magnitude proportional to the input offset voltage. The differential output signal is "un-chopped" out of phase with the "chopping" of the externally applied differential input signal. This effectively cancels the effect of the input offset voltage, and also effectively cancels the effect of 1/f noise generated in the amplifier.

The closest prior art is believed to include
  (1) ordinary chopper-stabilized operational amplifiers including input chopping switch circuitry coupled to the (+) and (−) inputs of an operational amplifier and output chopping switch circuitry coupled to the corresponding (+) and (−) outputs of the operational amplifier,
  (2) an instrumentation amplifier having a structure similar to that shown in FIG. 1 except that operational amplifiers 2 and 3 are not chopper stabilized and instead the input signals Vin+ and Vin− are "chopped" or "swapped" ahead of operational amplifiers 2 and 3 and the output signals Vout+ and Vout− are "un-chopped" or "un-swapped", and
  (3) use of conventional gain boost amplifiers in a folded cascode stage of an operational amplifier as shown in Prior Art FIG. 7.

The above-mentioned ordinary chopper-stabilized operational amplifiers provide low 1/f noise and low offset drift, but have the disadvantage that the output signals of the core amplifier, which may undergo large magnitude voltage swings (depending on the loop gain), must be un-chopped, i.e. "un-swapped", at the chopping frequency. Therefore, the prior chopper-stabilized operational amplifiers have slow signal settling, and a large amount of power consumption is required to keep them operating properly at the chopping frequency. In the prior art operational amplifiers in which the input is "chopped" and output is "un-chopped", if gain boost amplifiers are used they are normally located outside of the chopping loop. Also, most prior art chopper-stabilized operational amplifiers require more than two main amplifier stages, in some cases as many as five, to obtain an acceptably high open loop gain. (See U.S. Pat. No. 6,002,299 issued Dec. 14, 1999 to Thomsen.) This results in complex circuitry and high power consumption.

A simplified diagram of the above mentioned folded cascode circuit including a gain boost amplifier is shown in Prior Art FIG. 7, with the same or similar reference numerals to designate the same or similar elements that are shown in subsequently described FIGS. 2A-2C. A shortcoming of the gain boosted folded cascode circuit of Prior Art FIG. 7 is that the bias voltage VB3 applied to the gate of cascode transistor 49A needs to be very precisely controlled because (1) if VB3 is too high, the drain-to-source voltage VDS of transistor 50A will go into its triode region as the voltage on conductor 47A node voltage decreases, causing Vout to increase toward positive supply voltage VDD, (2) if VB3 is too low, the 1/f noise from the gain boost amplifier increases due to a decrease in the channel resistance of current source transistor 45, resulting in non-linear circuit operation, and (3) if VB3 is lowered more than a small amount, the 1/f noise is unacceptably increased. Therefore, the circuit of Prior Art FIG. 7 usually requires a trade-off to be made between the linearity of the operational amplifier and the 1/f noise. Therefore if the linearity is to be optimized, then the noise performance must be sacrificed.

Thus, there is an unmet need for an improved operational amplifier design which avoids the need to provide a very narrow range of bias voltages in a folded cascode circuit in order to provide both low 1/f noise and low offset drift.

There also is an unmet need for an improved chopper-stabilized operational amplifier having both low 1/f noise and low offset drift.

There also is an unmet need for an improved chopper-stabilized operational amplifier having both low 1/f noise and low offset drift, and also having relatively low power consumption.

There also is an unmet need for an improved chopper-stabilized operational amplifier having both low 1/f noise and low offset drift which requires only two main amplifier stages to achieve acceptably high open loop gain.

SUMMARY OF THE INVENTION

It is an object of the invention to provide an improved operational amplifier design which avoids the need to provide a very narrow range of bias voltages in a folded cascode circuit in order to provide both low 1/f noise and low offset drift.

It is another object of the invention to provide an improved chopper-stabilized operational amplifier having both low 1/f noise and low offset drift.

It is another object of the invention to provide an improved chopper-stabilized operational amplifier having both low 1/f noise and low offset drift, and also having relatively low power consumption.

It is another object of the invention to provide an improved chopper-stabilized operational amplifier having both low 1/f noise and low offset drift which requires only two main amplifier stages to achieve acceptably high open loop gain.

Briefly described, and in accordance with one embodiment, the present invention provides an amplifier circuit including an input chopping circuit (26) for chopping first (7) and second (8) input signals, a transconductance stage (27) for amplifying an output of the chopping circuit (26) and applying it to the input of a folded cascode stage (28) and to the input of an un-chopping circuit (33) and also to the input of a chopper-stabilized gain boost amplifier (32) in the folded cascode stage (28). The output of the un-chopping circuit drives sources of cascode transistors (49A,50A) of the folded cascode stage. The gain boost amplifier includes another transconductance stage (71A,B) having another un-chopping circuit (88) coupled to the gate of one of the cascode in transistors (50A) of the folded cascode stage (27). The drains of the cascode transistors of the folded cascode stage drive a class AB output stage. The amplifier provides both highly linear operation and low 1/f noise.

In a described embodiment the amplifier circuitry includes an input chopping circuit (26) for chopping first (7) and second (8) input signals, a first differential transconductance stage (27) having first (7A) and second (8A) input terminals coupled to corresponding outputs of the input chopping circuit (26), the first differential transconductance stage (27) also having first (43A) and second (43B) outputs and a first folded cascode stage (28). The first folded cascode stage (20) includes first (44) and second (45) current source transistors each having a first electrode (e.g., a drain), a second electrode (e.g., a source), and a control electrode (e.g., a gate), the first electrodes of the first (44) and second (45) current source transistors being connected to the first (43A) and second (43B) outputs, respectively, of the transconductance stage (27), the second electrodes of the first and second (45) current source transistors being coupled to a first supply voltage (e.g., ground). First (49A) and second (50A) cascode transistors each have a first electrode, a second electrode, and a control electrode. A first un-chopping circuit (33) has first and second inputs connected to the first (43A) and second (43B) outputs, respectively, of the first differential transconductance stage (27), and first (55A) and second (55B) outputs coupled to the second electrodes of the first (49A) and second (50A) cascode transistors, respectively. A first chopper-stabilized gain boost amplifier (32) has first and second inputs coupled to the first (43A) and second (43B) outputs of the first differential transconductance stage (27) and an output coupled to the control electrode of the second cascode transistor (50A). An output stage (34) has a first input (47A) coupled to the first electrode of the second (50A) cascode transistor, wherein the input chopping circuit (26), the first differential transconductance stage (27), the first folded cascode stage (28), and the output stage (34) form a first operational amplifier (2). Each of the first (44) and second (45) current source transistors and each of the first (49A) and second (50A) cascode transistors may be a MOSFET (metal oxide semiconductor field effect transistor) having a drain as its first electrode, a source as its second electrode, and a gate as its control electrode. A sufficiently low bias voltage (VB3) is applied to the gate of the first cascode transistor (49A) to prevent the second (50A) cascode transistors from going into its triode region over a predetermined range of operating temperatures and integrated circuit process parameters.

In the described embodiment, the first chopper-stabilized gain boost amplifier (32) includes a second differential transconductance stage (71A,71B) having first (75A) and second (75B) outputs coupled to first and second inputs of a second folded cascode stage (72), wherein the second folded cascode stage (72) includes a second un-chopping circuit (88) and third (76A) and fourth (76B) current source transistors having drains coupled to the first (75A) and second (75B) outputs of the second differential transconductance stage (71A,71B), respectively, and wherein the second un-chopping circuit (88) includes first and second outputs coupled to sources of third (79A) and fourth (79B) cascode transistors, respectively, of the second folded cascode stage (72). A drain of the fourth cascode transistor (79B) is coupled to the gate of the second cascode transistor (50A). The first folded cascode stage (28) includes fifth (49) and sixth (50) cascode transistors, fifth (51) and sixth (52) current source transistors, a third un-chopping circuit (31), and a second chopper-stabilized gain boost amplifier (30), the third un-chopping circuit (31) having a first terminal (69A) coupled to a drain of the fifth current source transistor (51), a second terminal (56A) coupled to a source of the fifth cascode transistor (49), a third terminal (69B) coupled to a drain of the sixth current source transistor (52), and a fourth terminal (56B) coupled to a source of the sixth cascode transistor (50). The second chopper-stabilized gain boost amplifier (30) has first and second inputs coupled to the drains of the fifth (51) and sixth (52) current source transistors, respectively, and an output coupled to a gate of the sixth cascode transistor (50). The output stage (34) has a second input (48) coupled to a drain of the sixth cascode transistor (50). The second folded cascode circuit (72) further includes a fourth un-chopping circuit (89) and seventh (83A) and eighth (83B) current source transistors having drains coupled to first (84A) and second (84B) terminals, respectively, of the fourth un-chopping circuit (89). The fourth un-chopping circuit (89) includes third and fourth terminals coupled to sources of seventh (80A) and eighth (80B) cascode transistors, respectively. A drain of the eighth cascode transistor (80B) is coupled to the gate of the second cascode transistor (50A). The third un-chopping circuit (31) is substantially a mirror image of the first un-chopping circuit (33), and the second chopper-stabilized gain boost amplifier (30) is substantially a mirror image of the first chopper-stabilized gain boost amplifier (32). The output stage (34) is a class AB output stage.

In one embodiment, the amplifier circuitry includes a first chopper-stabilized operational amplifier (2) which includes the input chopping circuit (26), the first differential transconductance stage (27), the first folded cascode stage (28), and the output stage (34). The amplifier circuitry further includes an instrumentation amplifier (1) which includes the first chopper-stabilized operational amplifier (2) and which also includes a second chopper-stabilized operational amplifier (3) which is substantially similar to the first chopper-stabilized operational amplifier (2). The instrumentation amplifier (1) includes a first input resistor (5) coupling a first input signal (Vin+) to a first input (+) of the first chopper-stabilized operational amplifier (2), a first feedback resistor (R1) coupled between a second input (−) and an output (9) of the first chopper-stabilized operational amplifier (2). A second input resistor (6) couples a second input signal (Vin−) to a first input (+) of the second chopper-stabilized operational amplifier (3). A second feedback resistor (R3) is coupled between a second input (−) and an output (17) of the second chopper-stabilized operational amplifier (3). A third resistor (R2) is coupled between the second input (−) of the first chopper-stabilized operational amplifier (2) and the second input (−) of the second chopper-stabilized operational amplifier (3), and a first output (Vout+) of the instrumentation amplifier (1) is coupled to the output (9) of the first chopper-stabilized operational amplifier (2). A second output (Vout−) of the instrumentation amplifier (1) is coupled to the output (17) of the second chopper-stabilized operational amplifier (3).

The invention also provides a method of operating amplifier circuitry including chopping first (7) and second (8) input signals by means of a chopping circuit (26), amplifying an output of the chopping circuit (26) to produce a first intermediate differential signal (43A,B) and coupling the first intermediate differential signal (43A,B) between input terminals of a first folded cascode stage (28), un-chopping the first intermediate signal (43A,B) by means of a first un-chopping circuit (33) to produce a second intermediate signal (55A,B), amplifying the second intermediate signal (55A,B) by means of a first cascode transistor (50A) to produce a third intermediate signal (48,47A). The first intermediate signal (43A,B) is amplified by means of a first chopper-stabilized gain boost amplifier (32) to produce a fourth intermediate signal (86B), and the fourth intermediate signal (86B) is amplified by means of the first cascode transistor (50A) to contribute to the third intermediate signal (48,47A). The third intermediate signal (48,47A) is amplified by means of an output stage (34).

In one embodiment, the amplifier circuit includes a chopping circuit (26) for chopping first (7) and second (8) input signals, means (27) for amplifying an output of the chopping circuit (26) to produce a first intermediate differential signal (43A,B) and coupling the first intermediate differential signal (43A,B) between input terminals of a first folded cascode stage (28), means (33) for un-chopping the first intermediate signal (43A,B) to produce a second intermediate signal (55A,B), a first cascode means (50A) for amplifying the second intermediate signal (55A,B) to produce a third intermediate signal (48,47A), chopper-stabilized gain boost amplifier means (32) for amplifying the first intermediate signal (43A,B) and un-chopping the amplified first intermediate signal to produce a fourth intermediate signal (86B) and amplifying the fourth intermediate signal (86B) by means of the first cascode means (50A) to contribute to the third intermediate signal (48,47A), and means (34) for amplifying the third intermediate signal (48,47A) to produce an output signal (Vout).

DETAILED DESCRIPTION OF THE PREFERRED EMBODIMENTS

Figure 1:
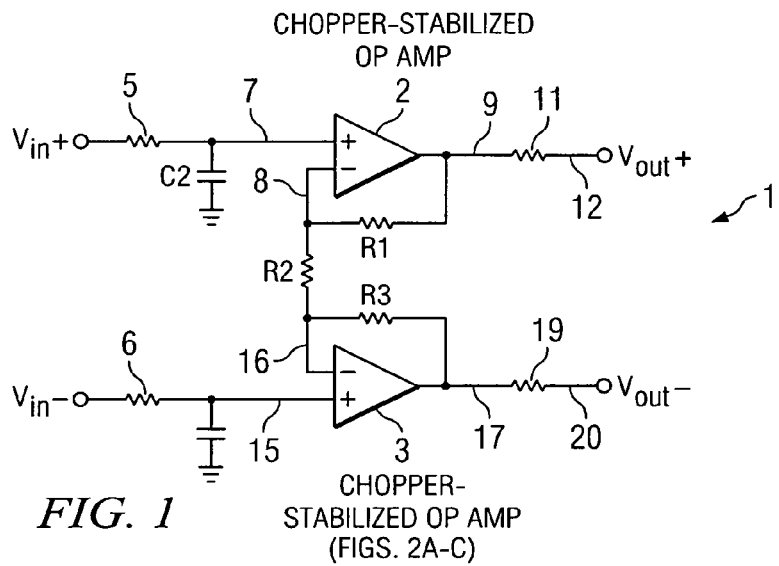
FIG. 1 is a diagram of one embodiment of the chopper-stabilized instrumentation amplifier of the present invention.

Referring to FIG. 1, an instrumentation amplifier 1 includes an input terminal receiving an input signal Vin+ and coupled by a resistor 5 and conductor 7 to the (+) input of a chopper-stabilized operational amplifier 2. Another input terminal receiving an input signal Vin− is coupled by a resistor 6 and conductor 15 to the (+) input of another chopper-stabilized operational amplifier 3. An implementation of chopper-stabilized operational amplifier 2 is shown in FIG. 2. Chopper-stabilized operational amplifiers 2 and 3 are the same. The (−) input of chopper-stabilized operational amplifier 2 is connected by conductor 8 to one terminal of each of resistors R1 and R2. The other terminal of resistor R1 is connected by conductor 9 to the output of operational amplifier 2 and to one terminal of a resistor 11, the other terminal of which is connected to conductor 12 on which in output signal Vout+ is produced. Similarly, the (−) input of operational amplifier 3 is connected by conductor 16 to one terminal of resistor R3 and the other terminal of resistor R2. The other terminal of resistor R3 is connected by conductor 17 to the output of operational amplifier 3 and to one terminal of a resistor 19, the other terminal of which is connected to conductor 20 on which in output signal Vout− is produced.

Figure 2B:
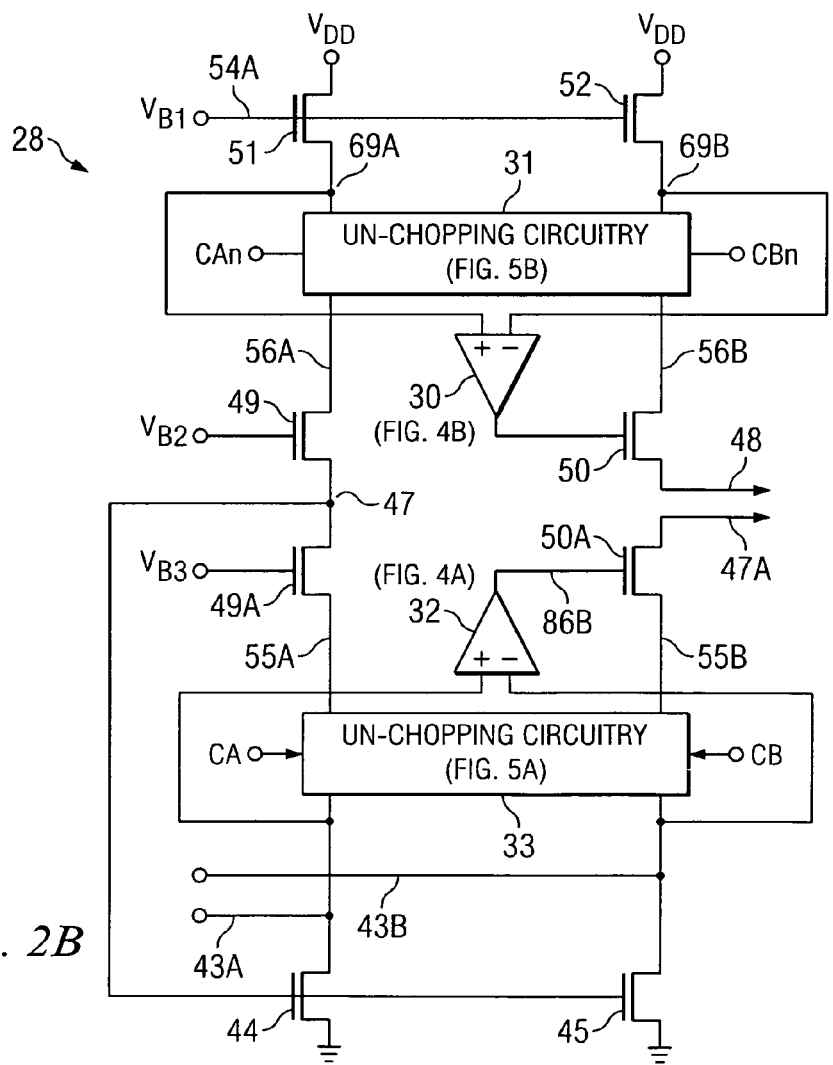
FIG. 2B is a schematic diagram of folded cascode stage 28 shown in FIG. 2A.
Figure 2A:
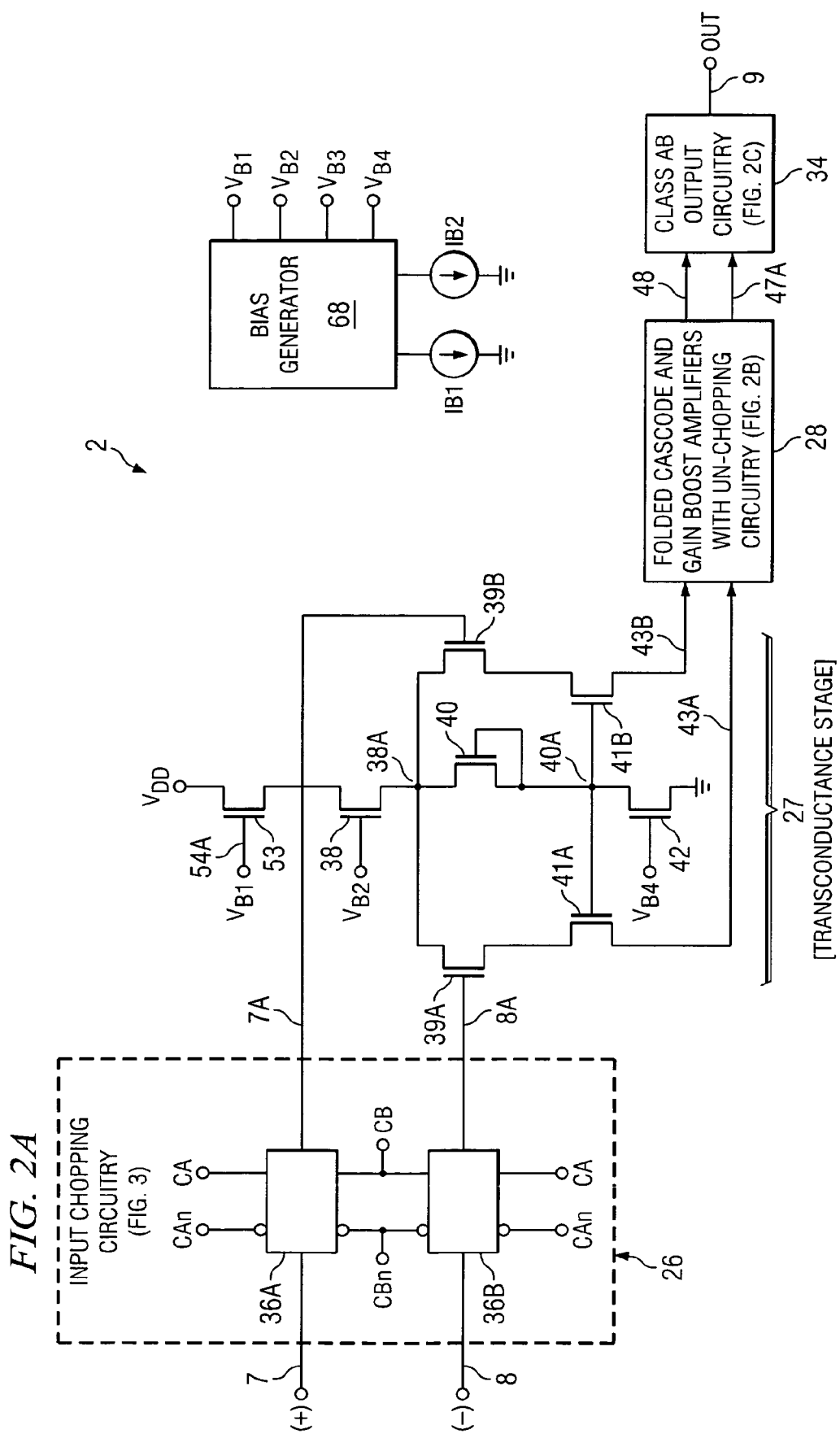
FIG. 2A is a diagram of the circuitry utilized to implement each of the chopper-stabilized operational amplifiers included in FIG. 1.
Figure 3:
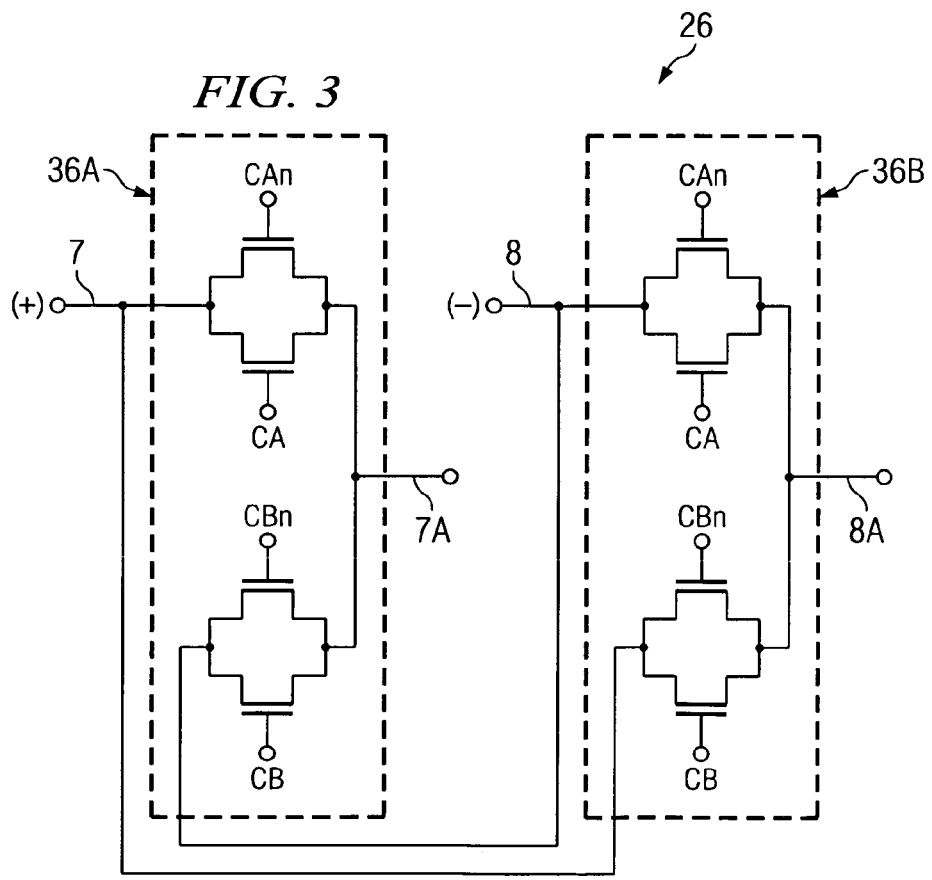
FIG. 3 is a schematic diagram of input chopping circuit 26 of FIG. 2A.

Referring to FIG. 2A, chopper-stabilized operational amplifier 2 includes an input chopping stage 26, a gm stage 27, gain-boosted folded cascode stage 28, and a class AB stage 34. The (+) input terminal of chopper-stabilized operational amplifier 2 is connected by conductor 7 to one input terminal of each of two dual CMOS transmission gate switch circuits 36A and 36B of input chopping stage 26. FIG. 3 shows a schematic drawing of dual CMOS transmission gate switches 36A and 36B. The (−) input of operational amplifier 2 is connected by 8 to another input terminal of each of dual CMOS transmission gate switch circuits 36A and 36B. An output terminal of dual CMOS transmission gate switch circuit 36A is connected by conductor 7A to the (+) input of gm stage 27, and another output terminal of dual CMOS transmission gate switch circuit 36B is connected by conductor 7B to the (−) input of gm stage 27.

Transconductance (gm) stage 27 in FIG. 2A is a fairly typical transconductance stage, which includes a cascoded P-channel tail current source transistor 38 having its source coupled to VDD by means of a P-channel transistor 53 and its drain connected by conductor 38A to the sources of P-channel input transistors 39A and 39B, the gates of which are also connected to conductors 7A and 8A, respectively. (Tail current source 38 could be omitted, but it improves the power supply noise rejection of transconductance stage 27.) The sources of input transistors 39A and 39B are connected by conductor 38A to the source of a diode-connected P-channel transistor 40, the drain of which is connected by conductor 40A the gates of a pair of P-channel cascode transistors 41A and 41B. Input transistors 39A and 39B ordinarily are very large, meaning they have a large channel-width-to-channel-length ratio, in order to achieve a large transconductance value gm. The sources of cascode transistors 41A and 41B, which are relatively small transistors, are connected to the drains of input transistors 39A and 39B, respectively, to isolate their parasitic capacitances from conductors 43A and 43B and thereby reduce the parasitic capacitances associated with conductors 43A and 43B. (This improves the phase margin of the chopper-stabilized operational amplifier.)

The gates of cascode transistors 41A and 41B are also connected to the drain of a N-channel transistor 42, the gate of which is connected to a bias voltage VB4 generated by a bias generator circuit 68 which is biased by current sources IB1 and IB2. Diode-connected transistor 40 and current source transistor 42 cause the bias voltage on the gates of cascode transistors 41A and 41B to track with voltage changes of the sources of input transistors 39A and 39B. The drains of cascode transistors 41A and 41B are connected by conductors 43A and 43B, respectively, to the inputs of a chopper-stabilized gain-boosted folded cascode circuit 28, details of which are shown in FIG. 2B. When the input voltages on conductors 7 and 8 change, the source voltage (on conductor 38A) of input transistors 39A and 39B follows, and therefore the gate and drain voltage (on conductor 40A) of diode-connected transistor 40 also follows, causing cascode transistors 41A and 41B to be always properly biased.

Figure 8:
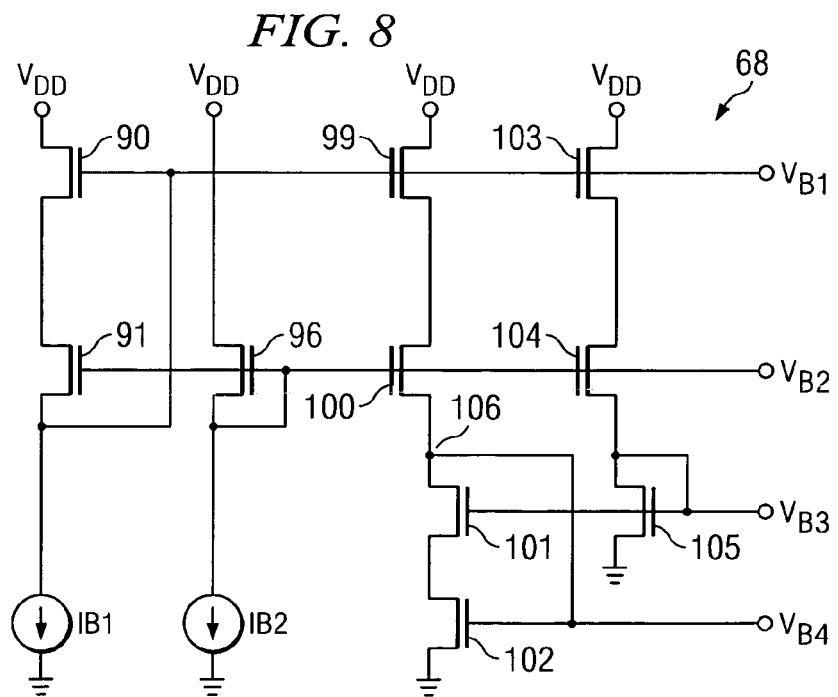
FIG. 8 is a schematic diagram of block 68 in FIG. 2A.

Bias voltage generator circuit 68 in FIG. 2A is shown in more detail in FIG. 8. Referring to FIG. 8, bias generator circuit 68 produces bias voltages VB1, VB2, VB3, and VB4. VB1 is connected to the gates of P-channel transistors 90, 99 and 103. VB2 is connected to the gates of P-channel transistors 91, 96, 100 and 104. VB3 is connected to the gates of-channel transistors 101 and 105, and VB4 is connected to the gate of-channel transistor 102. The source of transistor 90 is connected to VDD and its drain is connected to the source of transistor 91, the drain of which is connected to both VB1 and one terminal of a current source IB1, the other terminal of which is connected to ground. The source of transistor 96 is connected to VDD and its gate and drain are connected to VB2 and to one terminal of a current source IB2, the other terminal of which is connected to ground. The source of transistor 99 is connected to VDD and its drain is connected to the source of transistor 100. The drain of transistor 100 is connected by conductor 106 to the drain of transistor 101 and to the gate of transistor 102 and hence to bias voltage VB4. The source of transistor 101 is connected to the drain of transistor 102, the source of which is connected to ground. The source of transistor 103 is connected to VDD and its drain is connected to the source of transistor 104. The drain of transistor 104 is connected to the drain and gate of transistor 105, the source of which is is connected to ground. Transistors 96 and 105 are relatively long-channel transistors, in order to obtain large VGS voltages for properly biasing transistors 91 and 101. Transistor 105 can be a composite transistor including a number of N-channel transistors connected in series and all having their gates connected to VB3, with one or more of the series-connected transistors having its gate electrically shorted to its drain by means of a laser-cuttable link to allow laser trimming adjustment of VB3.

Bias voltage generator circuit 68 produces VB1=VDD−VGS(90), VB2=VDD−VGS(96), VB3=VGS (105)+VDS (102), and VB4=VGS(102).

Figure 5A:
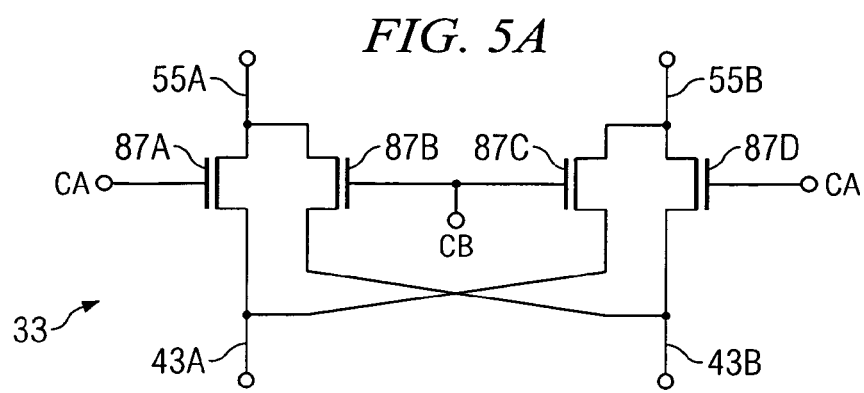
FIGS. 5A and 5B are schematic diagrams of un-chopping circuits 33 and 31, respectively, of FIG. 2B.

Referring to FIG. 2B, folded cascode circuit 28 includes N-channel current source transistors 44 and 45 having their sources connected to ground, their gates connected to conductor 47, and their drains connected by conductors 43A and 43B to first and second inputs of un-chopping circuit 33, respectively. Conductors 43A and 43B are also coupled directly to the (+) and (−) inputs, respectively, of a chopper-stabilized gain boost amplifier 32. The details of un-chopping circuit 33 are shown in FIG. 5A. A first output of chopping circuit 33 is connected by conductor 55A to the source of-channel cascode transistor 49A, the drain of which is connected by conductor 47 to the drain of a P-channel cascode transistor 49. The gates of cascode transistors 49A and 49 are connected to bias voltages VB3 and VB2, respectively. A second output of un-chopping circuit 33 is connected by conductor 55B to the source of a N-channel cascode transistor 50A, the drain of which is connected to conductor 47A. The gate of cascode transistor 50A is connected by conductor 86B to the output of chopper-stabilized gain boost amplifier 32, and the drain of transistor is connected by conductor 47A to the (−) input of class AB output circuit 34.

Figure 5B:
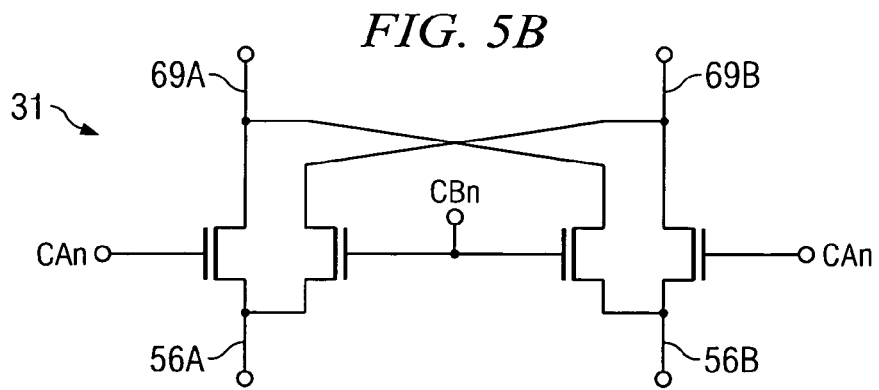

The source of cascode transistor 49 is connected to a first output of an un-chopping circuit 31, the details of which are shown in FIG. 5B. A second output of chopping circuit 31 is connected to the source of a P-channel cascode transistor 50, the drain of which is connected by conductor 48 to a (+) input of class AB output circuit 34 of FIG. 2A. The gate of cascode transistor 50 is connected to the output of another chopper-stabilized gain boost amplifier 30, the (+) input of which is connected by conductor 69A to a first input of un-chopping circuit 31 and to the drain of a P-channel current source transistor 51, the source of which is connected to VDD. The (−) input chopper-stabilized gain boost amplifier 30 is connected by conductor 69B to a second input of un-chopping circuit 31 and to the drain of a second P-channel current source transistor 52, the source of which is connected to VDD. The gates of transistors 51 and 52 are connected by conductor 54A to bias voltage VB1. The effect of gain boost amplifiers 30 and 32 is to boost the open-loop gain of chopper-stabilized operational amplifier 2 from about 96 dB to about 180 dB by increasing the output (drain) impedances of cascode transistors 50 and 50A.

Figure 6A:
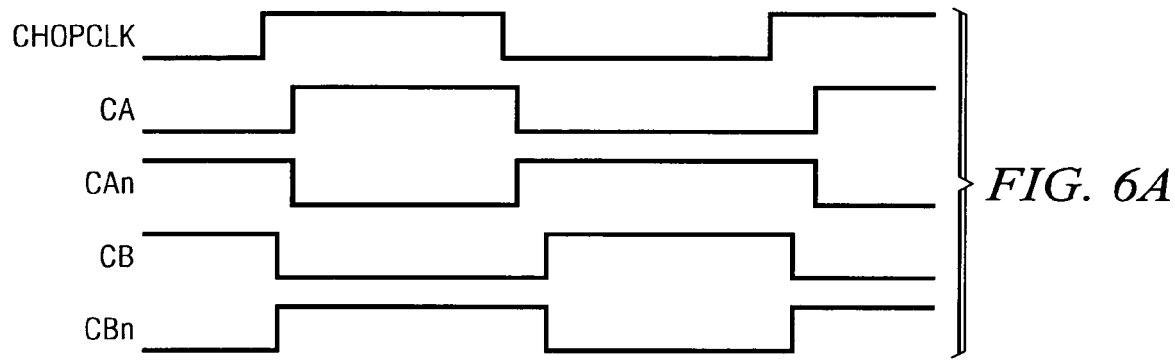
FIG. 6A is a timing diagram illustrating the chopping signals and waveforms useful in describing the operation of FIGS. 1, 2A-C, 3, 4A, 4B, 5A and 5B.
Figure 6B:
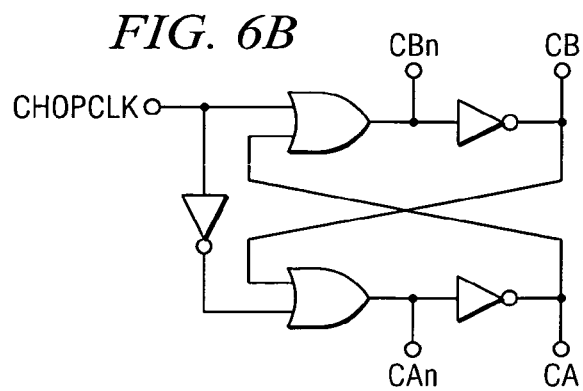
FIG. 6B is a clock generating circuit for generating the signal shown in FIG. 6A.
Figure 7:
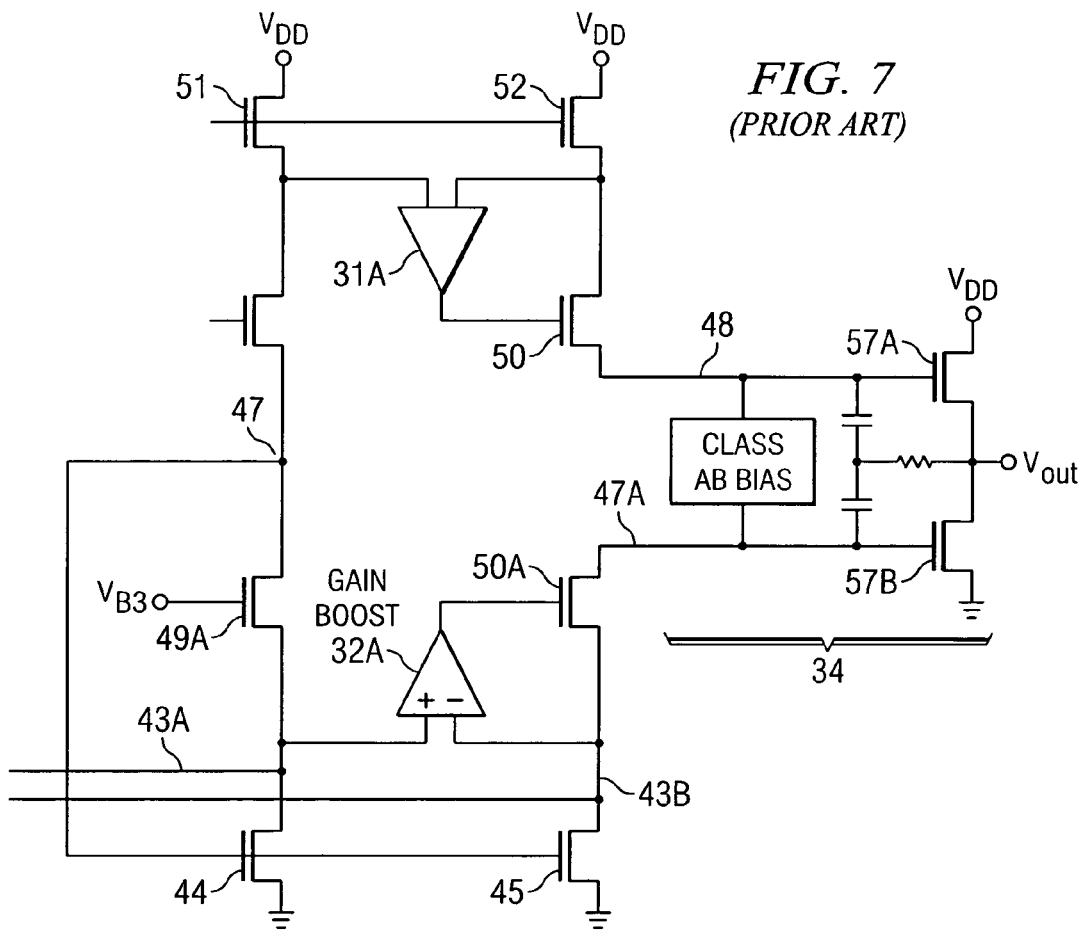
FIG. 7 is a simplified diagram of prior art folded cascode circuitry and class AB output circuitry of an operational amplifier.

Un-chopping circuit 33 is controlled by chopping signals CA and CB, and un-chopping circuit 31 is controlled by chopping signals CAn and CBn. Chopping signals CA, CAn, CB and CBn appear in the timing diagram of FIG. 6A, and are generated in response to a chopping clock signal CHOPCLK by means of the simple logic circuitry shown in FIG. 6B.

Note that the input offset voltage that is canceled by the chopping and un-chopping operations is caused by mismatches in input transistors 39A and 39B of transconductance stage 27, and that the 1/f noise that is canceled by the chopping and un-chopping operations is generated mainly in input transistors 39A and 39B of transconductance stage 27 and the current source transistors 44, 45, 51 and 52 of gain-boosted folded cascode stage 28. Offset voltages due to mismatches between current source transistors 44 and 45 and between current source transistors 51 and 52 in FIG. 2B are essentially eliminated by the described chopper stabilization. The same is true for mismatches between the current source transistors in the folded-cascode stages of chopper-stabilized gain boost amplifiers 30 and 32.

Figure 2C:
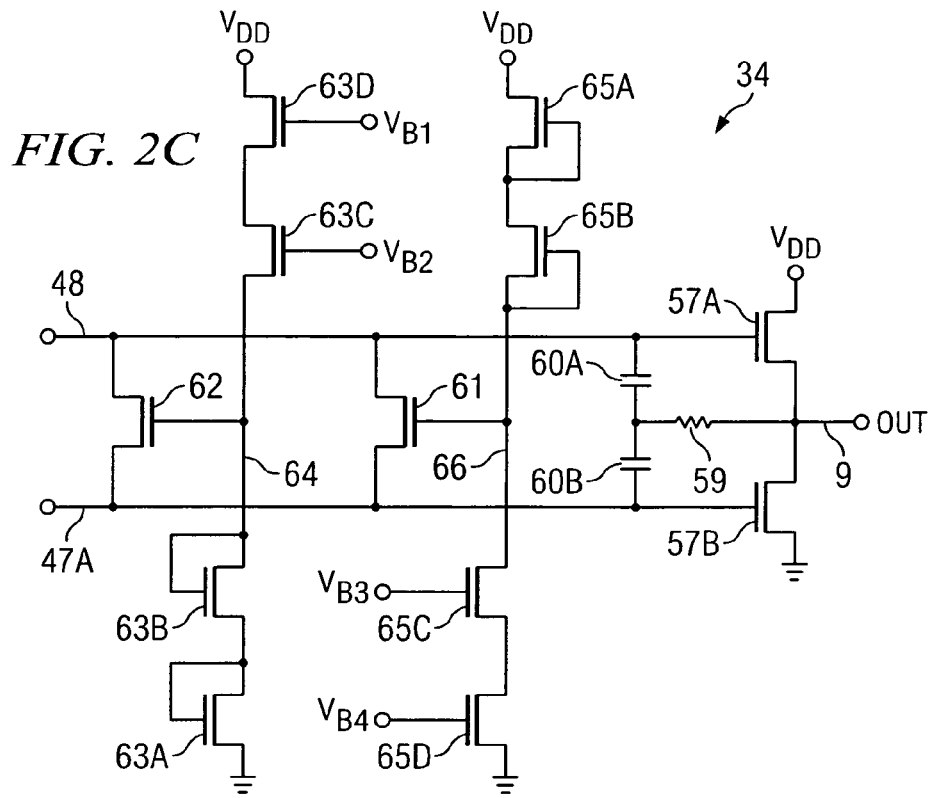
FIG. 2C is a schematic diagram of class AB stage 34 shown in FIG. 2A.

Referring to FIG. 2C, class AB output circuit 34 includes a P-channel output transistor 57A having a source connected to VDD, a gate connected to conductor 48, and a drain connected to output conductor 9 of operational amplifier 2, and also includes a N-channel output transistor 57B having a source connected to ground, a gate connected to conductor 47A, and a drain connected to output conductor 9. Compensation capacitors 60A and 60B each have a terminal coupled to conductor 48 and conductor 47A, respectively, and another terminal coupled by low value resistor 59 to output conductor 9. The source of a P-channel bias transistor 61 is connected to conductor 48, its drain is connected to conductor 47A and, and its gate is connected by conductor 66 to the drain of a N-channel transistor 65C having its gate connected to bias voltage VB3 and its source connected to the drain of a N-channel transistor 65D having its gate connected to VB4 and its source connected to ground. Conductor 66 also is connected to the gate and drain of diode-connected P-channel transistor 65B, the source of which is connected to the gate and drain of diode-connected P-channel transistor 65A, the source of which is connected to VDD. The source of a N-channel bias transistor 62 is connected to conductor 47A, its drain is connected to conductor 48, and its gate is connected by conductor 64 to the drain of a P-channel transistor 63C, the gate of which is connected to VB2 and the source of which is connected to the drain of a P-channel transistor 63D, the gate of which is connected to VB1 and the source of which is connected to VDD. Conductor 64 also is connected to the drain and gate of a N-channel diode-connected transistor 63B, the source of which is connected to the gate and drain of a N-channel transistor 63A, the source of which is connected to ground.

Figure 4A:
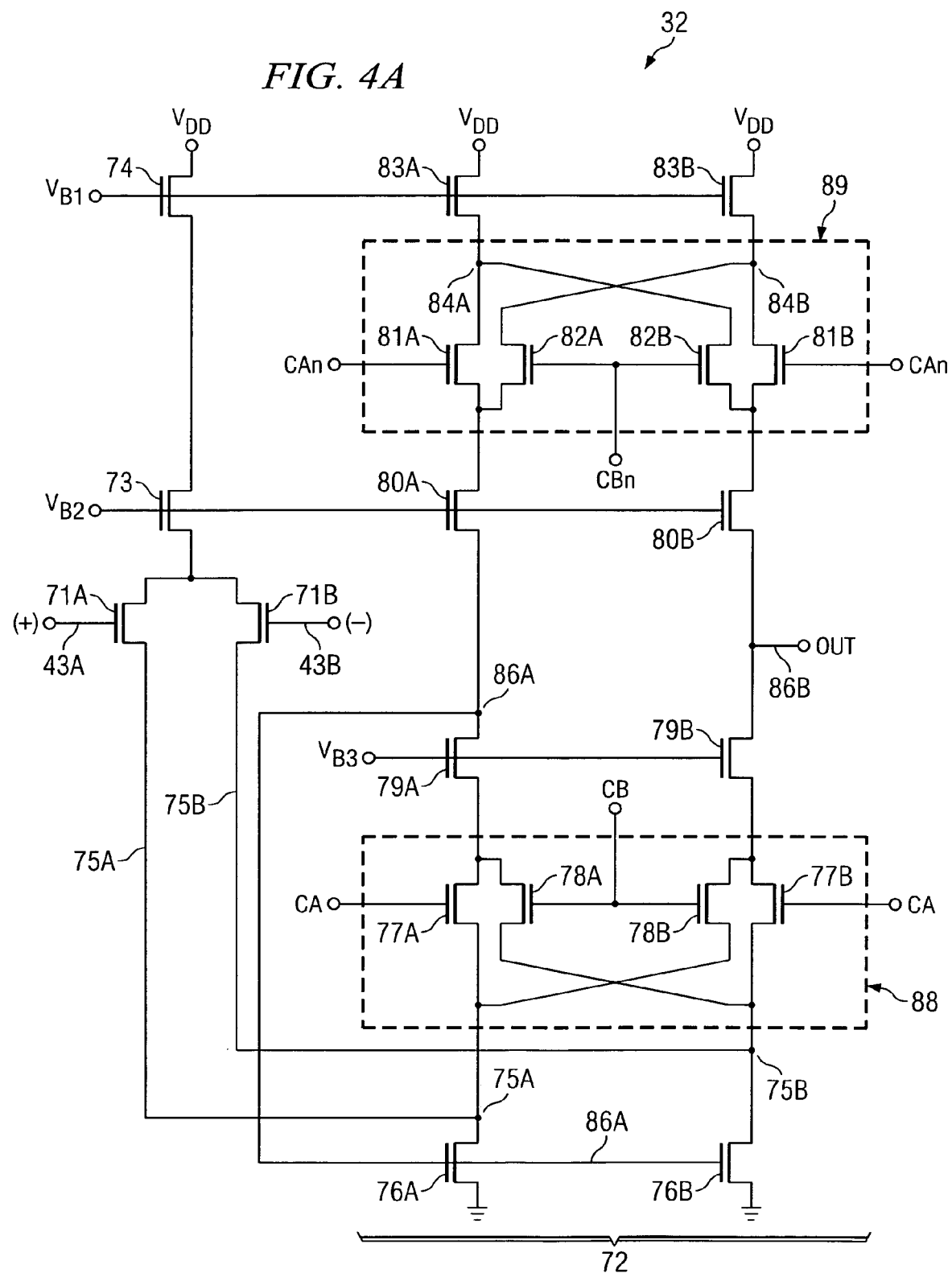
FIGS. 4A and 4B are schematic diagrams of the low-side gain boost amplifier 32 and high-side gain boost amplifier 30, respectively, of FIG. 2B.

Referring to FIG. 4A, chopper-stabilized gain boost circuit 32 includes a differential input stage including P-channel input transistors 71A and 71B having their sources coupled to the drain of a P-channel tail current transistor 73, the gate of which is connected to VB2. The source of tail current transistor 73 is connected to the drain of P-channel transistor 74, the source of which is connected to VDD and the gate of which is connected to VB1. The gates of input transistors 71A and 71B are connected to the output conductors 43A and 43B, respectively, of transconductance stage 27 (FIGS. 2A and 2B). The drains of input transistors 71A and 71B are connected by conductors 75A and 75B, respectively, to inputs of a folded cascode stage 72 of chopper-stabilized gain boost circuit 32.

Figure 4B:
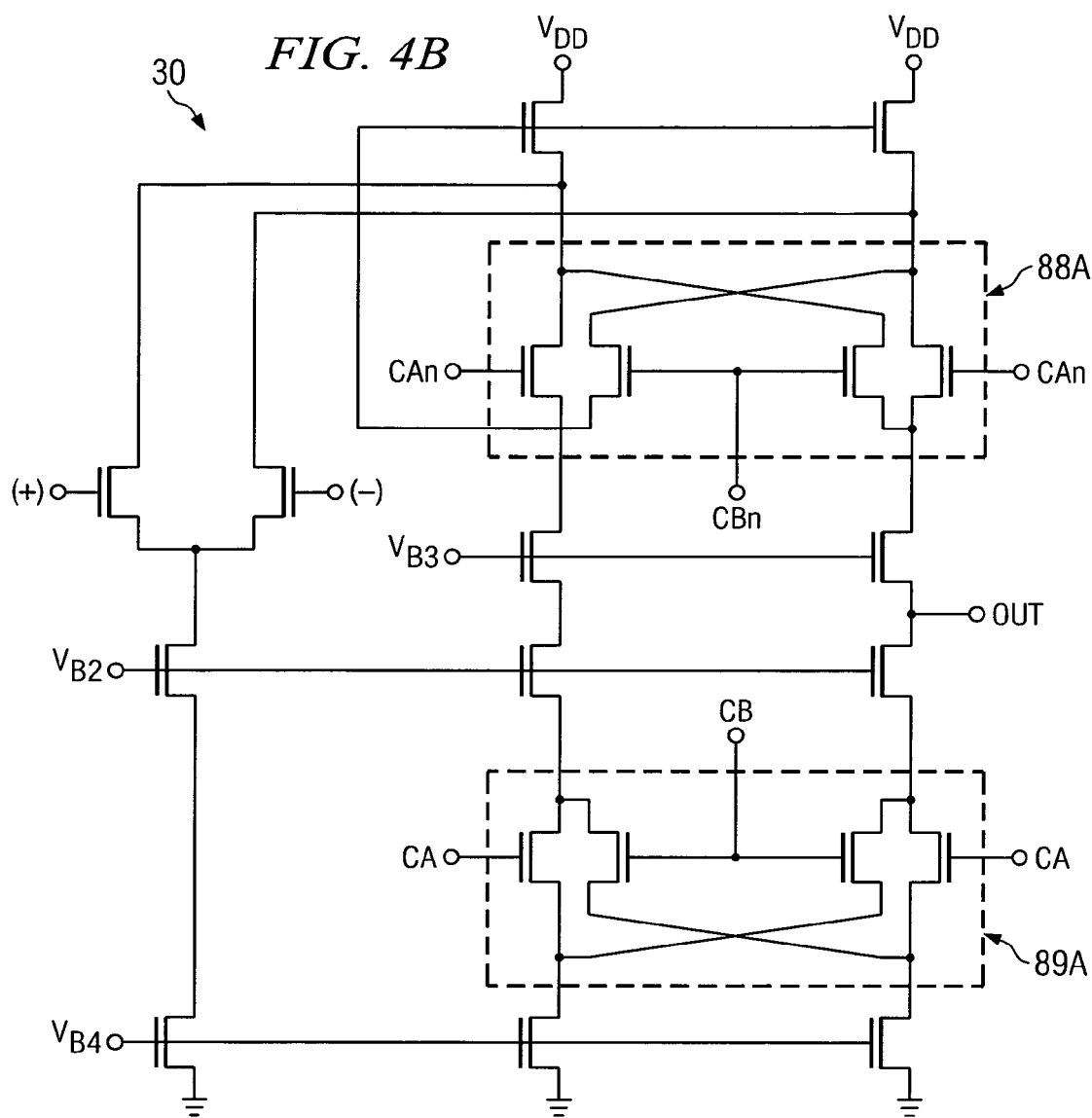

Folded cascode stage 72 includes N-channel current source transistors 76A and 76B, the sources of which are connected to ground. Their gates are connected to conductor 86A. The drain of current source transistor 76A is connected by conductor 75A to the sources of N-channel un-chopping transistors 77A and 78B, the gates of which are connected to chopping signals CA and CB, respectively. The drain of current source transistor 76B is connected by conductor 75B to the sources of N-channel un-chopping transistors 77B and 78A, the gates of which are connected to chopping signals CA and CB, respectively. The drains of un-chopping transistors 77A and 78A are connected to the source of N-channel cascode transistor 79A, and the drains of un-chopping transistors 77B and 78B are connected to the source of N-channel cascode transistor 79B. The gates of cascode transistors 79A and 79B are connected to VB3. The drain of cascode transistor 79A is connected by conductor 86A to the drain of P-channel cascode transistor 80A. The drain of cascode transistor 79B is connected by conductor 86B to the drain of P-channel cascode transistor 80B. The gates of cascode transistors 80A and 80B are connected to VB2. The source of cascode transistor 80A is connected to the drains of P-channel un-chopping transistors 81A and 82A, the gates of which are connected to CAn and CBn, respectively. The source of cascode transistor 80B is connected to the drains of P-channel un-chopping transistors 81B and 82B, the gates of which are connected to CAn and CBn, respectively. The source of P-channel current source transistor 83A is connected to VDD, its gate is connected to VB1, and its drain is connected by conductor 84A to the sources of un-chopping transistors 81A and 82B. The source of P-channel current source transistor 83B is connected to VDD, its gate is connected to VB1, and its drain is connected by conductor 84B to the sources of chopping transistors 81B and 82A. the structure and connections of chopper-stabilized gain boost amplifier 30 are shown in FIG. 4B and are a mirror image of those of gain boost amplifier 32, and therefore will not be described in detail.

Referring to FIG. 5A, chopping circuit 33 includes N-channel transistor 87A having its drain connected to conductor 55A, its gate connected to CA, and its source connected to conductor 43A. Conductor 55A also is connected to the drain of N-channel transistor 87B, the gate of which is connected to CB and the source of which is connected to conductor 43B. Conductor 43A is also connected to the source of N-channel transistor 87C, the drain of which is connected to conductor 55B and the gate of which is connected to CB. Conductor 55B also is connected to the drain of transistor 87D, the gate of which is connected to CA and the source of which is connected to conductor 43B. Un-chopping circuit 31 is shown in FIG. 5B, but its structure and connections are not described because they are a mirror image of those for chopping circuit 33 as shown FIG. 5A, wherein the transistors of un-chopping circuit 31 are P-channel transistors rather than N-channel transistors.

In the operation of chopper-stabilized operational amplifier 2, there are two chopping/un-chopping loops or paths. a first chopping/un-chopping path includes the signal path from input terminals 7 and 8 through input chopping circuitry 26 and input transistors 39A and 39B and conductors 43A and 43B of transconductance stage 27 and un-chopping circuits 33 and 31 of folded cascode stage 28. A second chopping/un-chopping path includes the signal path from input terminals 7 and 8 through input chopping circuitry 26 and input transistors 39A and 39B and conductors 43A and 43B of transconductance stage 27 and chopper-stabilized gain boost amplifiers 33 and 31. Chopping stage 26 performs the "chopping" of both the first and second chopping/un-chopping paths. If input transistors 39A and 39B are slightly mismatched, then the output currents in conductors 43A and 43B alternate in accordance with the input offset voltage, but if they are perfectly matched, then the output currents in conductors 43A and 43B do not vary according to the chopping frequency, but in any case the corresponding voltage changes between conductors 43A and 43B are very small.

Un-chopping circuits 33 and 31 perform the "un-chopping" of the first chopping/un-chopping path. During one chopping phase circuit 33 connects conductor 43A to conductor 55A and connects conductor 43B to conductor 55B, and during the alternate chopping phase circuit 33 connects conductor 43A to conductor 55B and connects conductor 43B to conductor 55B.

The internal signal swapping circuits 88 and 89 (FIG. 4A) of chopper-stabilized gain boost amplifier 32 and internal signal swapping circuits 88A and 89A (FIG. 4B) of chopper-stabilized gain boost amplifier 30 perform the "un-chopping" of the second chopping/un-chopping path. In the present invention, the gain boost amplifier extends, and therefore is included within, the second chopping path. Chopper-stabilized gain boost amplifier 32 has its inputs connected to a point at which the differential voltage swing is very low and consequently the internal signal settling times at that point are not problematic. The un-chopping that occurs in lower gain boost amplifier 32 performs un-chopping of the signals from the output 43A, 43B so the polarity of the output of lower gain boost amplifier 32 applied to the gate of cascode transistor 50A also is of the correct polarity and therefore its contribution to the signal on conductor 47A therefore also is of the correct polarity.

The operation of the above described circuitry is such that the bias voltage VB3 on the gate of transistor 49A (FIG. 2B) causes the voltage on conductor 43A to be set at a sufficiently low level to prevent transistor 50A from going into its triode mode over the expected range of temperature and supply voltages, thereby providing linear circuit operation. The same principle generally applies to the design of the upper portion, including cascode transistors 49 and 50, current source transistors 51 and 52, and chopper-stabilized gain boost amplifier 31, of folded cascode stage 28. The chopper-stabilized gain boost amplifier operates to cause the voltages on conductors 43A and 43B to be nearly equal by controlling the gate voltage of transistor 50A. Therefore the chopper-stabilized gain boost amplifier 32 effectively linearly controls the current of transistor 50A and the entire control loop of chopper-stabilized operational amplifier 2. Therefore, the low value of bias voltage VB3 is not critical over the expected range of integrated circuit process variations, and does not need to be precisely controlled to allow very linear circuit operation.

Referring to FIG. 2B, it should be appreciated that the voltage of conductor 47A typically is only about 700 millivolts, which has to be shared by both transistor 50A and transistor 45. If VB3 is increased, transistor 45 eventually will go into its triode region, causing increased 1/f noise even if transistor 50A does not go into its triode region (which causes nonlinear operation). Gain boost amplifier 32 operates to control transistor 50A so as to cause the voltage of conductor 55A to be equal to that of conductor 55B. Therefore, when VB3 is decreased sufficiently, transistors 44 and 45 go into their triode regions. This is significant, because a noise analysis of the circuitry including gain boost amplifier 32 and transistor 50A shows that the channel resistance (Rds) of transistor 45 in effect becomes a degeneration resistor for transistor 50A. Specifically, if the channel resistance of transistor 45 becomes very low, e.g., a few hundred ohms, this causes the noise of gain boost amplifier 32 to become significant unless gain boost amplifier 32 is chopper-stabilized. Noise analysis shows that if VB3 is sufficiently decreased, the degeneration resistance Rds of transistor 45 is reduced enough to cause the operational amplifier noise to be dominated by gain boost amplifier 32 unless it is chopper-stabilized.

The use of un-chopping circuits 33 and 31 and chopper-stabilized gain boost amplifiers 30 and 32 as shown in FIG. 2B avoids the above-mentioned prior art problem of having to make a trade-off between good linear circuit operation and low 1/f noise by allowing the bias voltage VB3 to have a very low value. This is because the low VB3 voltage level results in linear circuit operation by preventing transistor 50A from going into its triode region over the normal range of temperature and integrated circuit process parameters, and also because providing the above mentioned first and second chopping/un-chopping signal paths essentially eliminates the 1/f noise and thermal noise.

Also, the chopper-stabilized operational amplifiers using above described circuitry require only two main amplifier stages to achieve high open loop gain, and therefore the circuitry is less complicated and does not dissipate as much power as the prior art.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, while all of the transistors are illustrated as MOSFETs (metal oxide semiconductor field effect transistors), JFETs (junction field effect transistors) or bipolar transistors could be used.

What is claimed is:

1. Amplifier circuitry comprising:
   (a) an input chopping circuit for chopping first and second input signals;
   (b) a first differential transconductance stage having first and second input terminals coupled to corresponding outputs of the input chopping circuit, the first differential transconductance stage also having first and second outputs;
   (c) a first folded cascode stage including
      i. first and second current source transistors each having a first electrode, a second electrode, and a control electrode, the first electrodes of the first and second current source transistors being connected to the first and second outputs, respectively, of the transconductance stage, the second electrodes of the first and second current source transistors being coupled to a first supply voltage,
      ii. first and second cascode transistors each having a first electrode, a second electrode, and a control electrode,
      iii. a first un-chopping circuit having first and second inputs connected to the first and second outputs, respectively, of the first differential transconductance stage, and first and second outputs coupled to the second electrodes of the first and second cascode transistors, respectively, and
      iv. a first chopper-stabilized gain boost amplifier having first and second inputs coupled to the first and second outputs of the first differential transconductance stage and an output coupled to the control electrode of the second cascode transistor; and
   (d) an output stage having a first input coupled to the first electrode of the second cascode transistor, wherein the input chopping circuit, the first differential transconductance stage, the first folded cascode stage, and the output stage form a first operational amplifier.

2. The amplifier circuitry of claim 1 wherein each of the first and second current source transistors and each of the first and second cascode transistors is a MOSFET (metal oxide semiconductor field effect transistor) having a drain as its first electrode, a source as its second electrode, and a gate as its control electrode.

3. The amplifier circuitry of claim 2 wherein a sufficiently low bias voltage is applied to the gate of the first cascode transistor to prevent the second cascode transistor from going into its triode region over a predetermined range of operating temperatures and integrated circuit process parameters.

4. The amplifier circuitry of claim 2 wherein the first chopper-stabilized gain boost amplifier includes a second differential transconductance stage having first and second outputs coupled to first and second inputs of a second folded cascode stage, wherein the second folded cascode stage includes a second un-chopping circuit and third and fourth current source transistors having drains coupled to the first and second outputs of the second differential transconductance stage, respectively, and wherein the second un-chopping circuit includes first and second outputs coupled to sources of third and fourth cascode transistors, respectively, of the second folded cascode stage, a drain of the fourth cascode transistor being coupled to the gate of the second cascode transistor.

5. The amplifier circuitry of claim 3 wherein the first folded cascode stage includes fifth and sixth cascode transistors, fifth and sixth current source transistors, a third un-chopping circuit, and a second chopper-stabilized gain boost amplifier, the third un-chopping circuit having a first terminal coupled to a drain of the fifth current source transistor, a second terminal coupled to a source of the fifth cascode transistor, a third terminal coupled to a drain of the sixth current source transistor, and a fourth terminal coupled to a source of the sixth cascode transistor, the second chopper-stabilized gain boost amplifier having first and second inputs coupled to the drains of the fifth and sixth current source transistors, respectively, and an output coupled to a gate of the sixth cascode transistor, the output stage having a second input coupled to a drain of the sixth cascode transistor.

6. The amplifier circuitry of claim 5 wherein the second folded cascode circuit further includes a fourth un-chopping circuit and seventh and eighth current source transistors having drains coupled to first and second terminals, respectively, of the fourth un-chopping circuit, and wherein the fourth un-chopping circuit includes third and fourth terminals coupled to sources of seventh and eighth cascode transistors, respectively, a drain of the eighth cascode transistor being coupled to the gate of the second cascode transistor.

7. The amplifier circuitry of claim 6 wherein the first and second current source transistors and the first and second cascode transistors are N-channel transistors, and wherein the fifth and sixth current source transistors and the fifth and sixth cascode transistors are P-channel transistors.

8. The amplifier circuitry of claim 7 wherein the first un-chopping circuit includes N-channel first, second, third, and fourth switching transistors, the first input of the first un-chopping circuit being coupled to sources of the first and third switching transistors, the second input of the first un-chopping circuit being coupled to sources of the second and fourth switching transistors, the first output of the first un-chopping circuit being coupled to drains of the first and second switching transistors, the second output of the first un-chopping circuit being coupled to drains of the third and fourth switching transistors, gates of the first and fourth switching transistors being coupled to a first un-chopping signal, gates of the second and third switching transistors being coupled to a second un-chopping signal.

9. The amplifier circuitry of claim 8 wherein the second un-chopping circuit includes N-channel fifth, sixth, seventh, and eighth switching transistors, the first input of the first un-chopping circuit being coupled to sources of the fifth and seventh switching transistors, the second input of the first un-chopping circuit being coupled to sources of the sixth and eighth switching transistors, the first output of the first un-chopping circuit being coupled to drains of the fifth and sixth switching transistors, the second output of the first un-chopping circuit being coupled to drains of the seventh and eighth switching transistors, gates of the fifth and eighth switching transistors being coupled to a third un-chopping signal, gates of the sixth and seventh switching transistors being coupled to a fourth un-chopping signal.

10. The amplifier circuitry of claim 5 wherein the third un-chopping circuit is substantially a mirror image of the first un-chopping circuit.

11. The amplifier circuitry of claim 5 wherein the second chopper-stabilized gain boost amplifier is substantially a mirror image of the first chopper-stabilized gain boost amplifier.

12. The amplifier circuitry of claim 5 wherein the third un-chopping circuit is composed of P-channel switching transistors.

13. The amplifier circuitry of claim 6 wherein the output stage is a class AB output stage.

14. The amplifier circuitry of claim 13 wherein the class AB output stage includes first and second output transistors having gates coupled, respectively, to the drains of the second and sixth cascode transistors.

15. The amplifier circuitry of claim 14 wherein the first output transistor is a P-channel MOSFET, the second output transistor is a N-channel MOSFET, and wherein the class AB output stage includes a P-channel bias transistor having a source coupled to the gate of the first output transistor, a source coupled to the gate of the second output transistor, and a gate coupled to a first class AB bias voltage, and wherein the class AB output stage also includes a N-channel bias transistor having a source coupled to the gate of the second output transistor, a source coupled to the gate of the first output transistor, and a gate coupled to a second class AB bias voltage.

16. The amplifier circuitry of claim 3 wherein the amplifier circuitry includes a first chopper-stabilized operational amplifier which includes the input chopping circuit, the first differential transconductance stage, the first folded cascode stage, and the output stage.

17. The amplifier circuitry of claim 16 wherein the amplifier circuitry includes an instrumentation amplifier which includes the first chopper-stabilized operational amplifier and which also includes i. a second chopper-stabilized operational amplifier which is substantially similar to the first chopper-stabilized operational amplifier, the instrumentation amplifier including a first input resistor coupling a first input signal to a first input of the first chopper-stabilized operational amplifier, a first feedback resistor coupled between a second input and an output of the first chopper-stabilized operational amplifier, ii. a second input resistor coupling a second input signal to a first input of the second chopper-stabilized operational amplifier, a second feedback resistor coupled between a second input and an output of the second chopper-stabilized operational amplifier, iii. a third resistor coupled between the second input of the first chopper-stabilized operational amplifier and the second input of the second chopper-stabilized operational amplifier, and iv. a first output of the instrumentation amplifier being coupled to the output of the first chopper-stabilized operational amplifier, and a second output of the instrumentation amplifier being coupled to the output of the second chopper-stabilized operational amplifier.

18. A method of operating amplifier circuitry, comprising:

(a) chopping first and second input signals by means of a chopping circuit;

(b) amplifying an output of the chopping circuit to produce a first intermediate differential signal and coupling the first intermediate differential signal between input terminals of a first folded cascode stage;

(c) un-chopping the first intermediate signal by means of a first un-chopping circuit to produce a second intermediate signal;

(d) amplifying the second intermediate signal by means of a first cascode transistor to produce a third intermediate signal; and (e) amplifying the third intermediate signal by means of an output stage.

19. The method of claim 18 including amplifying the first intermediate signal by means of a chopper-stabilized gain boost amplifier to produce a fourth intermediate signal, and amplifying the fourth intermediate signal by means of the first cascode transistor to contribute to the third intermediate signal.

20. Amplifier circuitry comprising:
(a) a chopping circuit for chopping first and second input signals;
(b) means for amplifying an output of the chopping circuit to produce a first intermediate differential signal and coupling the first intermediate differential signal between input terminals of a first folded cascode stage;
(c) means for un-chopping the first intermediate signal to produce a second intermediate signal;
(d) a first cascode means for amplifying the second intermediate signal to produce a third intermediate signal;
(e) chopper-stabilized gain boost amplifier means for amplifying the first intermediate signal and un-chopping the amplified first intermediate signal to produce a fourth intermediate signal and amplifying the fourth intermediate signal by means of the first cascode means to contribute to the third intermediate signal; and
(f) means for amplifying the third intermediate signal to produce an output signal.

* * * * *